United States Patent [19]
Liu

[11] Patent Number: 6,030,732
[45] Date of Patent: Feb. 29, 2000

[54] IN-SITU ETCH PROCESS CONTROL MONITOR

[75] Inventor: Kun-Yi Liu, Taina, Taiwan

[73] Assignee: Taiwan Semiconductor Manufacturing Company, Hsin-Chu, Taiwan

[21] Appl. No.: 09/226,276

[22] Filed: Jan. 7, 1999

[51] Int. Cl.$^7$ .............................. G03F 9/00; H01L 21/306
[52] U.S. Cl. ................... 430/30; 438/16; 438/780
[58] Field of Search ......................... 438/16, 780; 430/30

[56] References Cited

U.S. PATENT DOCUMENTS 4,652,333  3/1987  Carney ..................................... 156/626
4,717,445  1/1988  Leung ...................................... 156/626

*Primary Examiner*—Christopher G. Young
*Attorney, Agent, or Firm*—George O. Saile; Stephen B. Ackerman

[57] ABSTRACT

During the course of manufacturing an IC, the thickness of the photoresist layer varies. In the presence of multiple steps, the difference between the maximum photoresist thickness and the minimum thickness can be quite substantial. It is sometimes the case that the minimum thickness is insufficient in some spots for proper exposure of the resist to be possible. The presence of such spots is detected by means of a monitor in the form of an optical mask comprising a group of lines whose width is close to the critical dimension together with an isolated line of similar width and a second, wider, isolated line. A photoresist image of the process monitor is formed in the kerf for each of the layers that is deposited, with the mask being shifted by about half its length between successive depositions. This ensures that a step is formed between successive layers so that if the photoresist layer is too thin at some point this will be reflected in the monitor. By measuring the widths of lines in the monitor, both in the photoresist image and in the subsequent etched image, the presence of regions where the photoresist is of less than adequate thickness can be inferred from the narrowing of the lines relative to their widths in the original optical monitor mask.

18 Claims, 2 Drawing Sheets

IN-SITU ETCH PROCESS CONTROL MONITOR

FIELD OF THE INVENTION

The invention relates to the general field of integrated circuit manufacturer with particular reference to determining whether or not photoresist processing has been satisfactory.

BACKGROUND OF THE INVENTION

In the course of manufacturing an integrated circuit, many layers of different materials get laid down. With few exceptions each of these layers is patterned and etched into various shapes, generally lines or holes. Each time that a fresh layer is deposited and patterned the result is the creation of an uneven surface. Although well-known planarization techniques exist for smoothing out the surface, it is not practical to planarize the surface with every new layer because poor topography can result in local areas as a consequence of multilevel metallization processes.

Thus, it is not unusual for the surface of an incomplete circuit to contain a number of steps. This is illustrated schematically in FIG. 1a which shows a number of different layers such as polysilicon 1, silicon dioxide 2, and silicon nitride 4, with a layer of metal 3 covering the topmost surface. If, now, photolithography is to be performed a layer of photoresist 15 is deposited over the entire surface by a process such as spin coating. The top surface of the photoresist layer is planar as seen in FIG. 1b. The result is that the thickness of the photoresist layer various in different parts of the surface. In particular, the difference between the maximum photoresist thickness H1 and the minimum thickness H2 can be quite substantial. It is often the case that H2 is insufficient for proper exposure of the resist to be possible at that location.

It is the purpose of the present invention to determine if such thinner-than-average photoresist layers are present and if they pose a problem. In this way the effectiveness of the photoresist can be monitored at all stages of the IC manufacturing process. Note that a simple inspection of the circuit will generally not be adequate since it is not always easy to predict just where such regions of less than adequate thickness may occur. If it should turn out that somewhere in the circuit the thickness of the photoresist is insufficient, the process can be scrapped then and there, rather than at a later stage, thereby saving unnecessary process steps.

In the course of searching for prior art no references that teach the method or structure of the present invention were encountered. The following were however found to be of interest. Carney (U.S. Pat. No. 4,652,333 March 1987) describes an in-situ etch process monitor but it is quite unlike that of the present invention, being aimed at the etching of hour glass shaped lines in silicon as part of the fabrication of buried heterostructures. Leung (U.S. Pat. No. 4,717,445 January 1988) describes an etch bias monitoring technique. The approach is to include a material known to be impervious to the etchant being used and to then compare its dimensions, after etching, with those of a photoresist pattern that was etched at the same time.

SUMMARY OF THE INVENTION

It has been at object of the present invention to provide a procedure for monitoring whether or not a photoresist layer across a non-planarized surface of an integrated circuit has sufficient thickness at all points.

Another object of the present invention has been to provide a design for a process monitor suitable for use in said procedure.

A further object of the invention has been that said procedure and said process monitor not interfere with the normal course of manufacturing an integrated circuit.

These objects have been achieved by means of a monitor in the form of an optical mask comprising a group of lines whose width is close to the critical dimension together with an isolated line of similar width and a second, wider, isolated line. A photoresist image of the process monitor is formed in the kerf for each of the layers that is deposited, with the mask being shifted by about half its length between successive depositions. This ensures that a step is formed between successive layers so that if the photoresist layer is too thin at some point this will be reflected in the monitor. By measuring the widths of lines in the monitor, both in the photoresist image and in the subsequent etched image, the presence of regions where the photoresist is of less than adequate thickness will be detected as a result of the narrowing of the lines relative to their widths in the original optical monitor mask.

DESCRIPTION OF THE PREFERRED EMBODIMENTS

Figure 2:
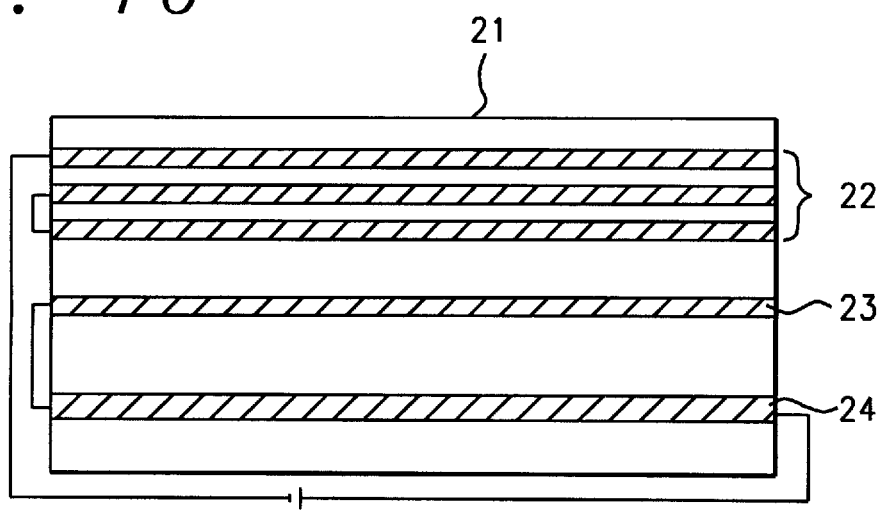
FIG. 2 illustrates the process monitor mask that is used to implement the present invention.

Referring now to FIG. 2, we illustrate there the general form of the monitor mask that is employed for implementing the procedure of the present invention. In its first application, the mask is an optical mask, as used in photolithography, and would, in general, be incorporated as part of the main process mask. This monitoring mask has three main sections, as shown in FIG. 2. Starting at the top, a group of three parallel lines 22 can be seen. Although 3 is a convenient number to use, in practice any quantity of lines, between about 1 and 100 in number, could be used. The widths of the lines is at or near the critical dimension of the circuit, being between about 0.3 and 1.5 microns, while the distance between them is between about 0.3 and 1.5 microns.

Spaced a distance between about 0.3 and 0.6 microns below lines 22 is a single line 23 whose width is between about 0.5 and 1 microns. While lines 22 represent a group of closely packed lines, line 23 represents an isolated line. The last component of the mask is line 24 which spaced between about 0.8 and 1.5 microns below line 23 and has a width that is between about 0.8 and 1.5 microns. It represents a line whose width is significantly greater than the critical dimension.

Figure 3:
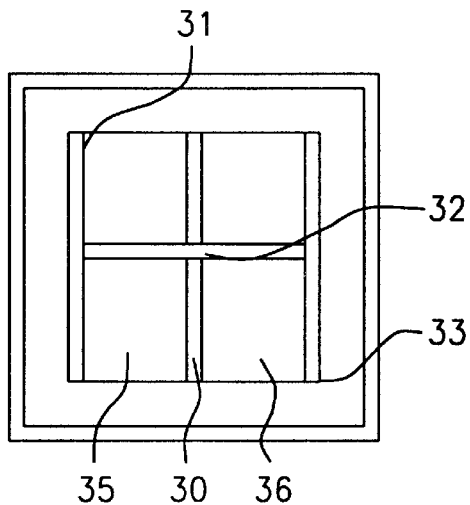
FIG. 3 shows part of the surface of a wafer including several chip images separated by kerf.

The monitor mask is introduced into the processing at the beginning of the deposition of a series of layers. Starting from a planar surface its use continues until the surface is to be planarized again. Its purpose is to determine if, at any time, the photoresist layer was too thin at any point. In FIG. 3 we show a part of a wafer surface that is made up of several chip images. Each of these images is separated from its neighbors by a channel referred to as the kerf (since it is the area that will later be destroyed by the saw blade when it cuts the wafer into individual chips). For example, chip images 35 and 36 are separated by kerf 30. Typical locations for the mask monitor would be at points 31, 32 and 33.

Once the first layer for which the monitor is to be used has been deposited, it is coated with photoresist and processed in the usual way with the added feature that several photoresist images of the monitor mask are placed at several positions within the kerf as already discussed. At this point the widths of all lines in the photoresist image are measured. The values so obtained are then compared with the previously determined line widths on the mask itself.

In general, the line widths measured in the photoresist image will be smaller than those in the original mask. This is normal and is due to distortion resulting from the proximity effect. However, if the resistant is too thin, the narrowing of lines in the resist image will be greater than normal. Thus, a set of criteria can be set up for determining whether or not there is a particular problem at each stage in the process. In general, if the widths of lines in the resist image are less than the corresponding widths in the mask, by between about 30 and 100 percent, the presence of a problem is indicated.

If the presence of a problem is indicated, and depending on its severity, the process will be terminated then and there, thereby saving subsequent process steps that are now known will yield unsatisfactory product. Assuming that a decision is made to proceed, etching of the layer covered by the photoresist pattern can now be performed. When this is completed the line widths in the etched pattern of the monitor mask are measured and compared to the originals. As for the photoresist pattern, if the widths of lines in the etch pattern image are less than the corresponding widths in the mask by between about 30 and 100 percent, the presence of a problem is indicated and, depending on the degree off severity, the process will be terminated at this point.

Figure 4:
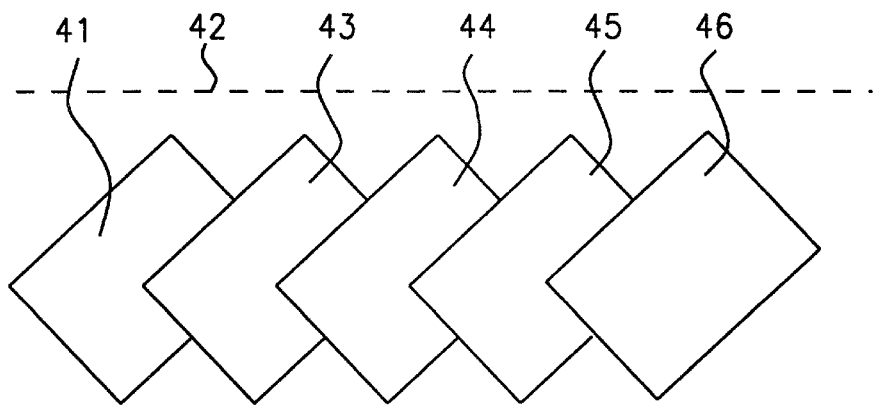
FIG. 4 shows how the monitor of FIG. 2 is shifted between successive depositions of multiple layers.

Assuming that the ratio of the two sets of widths met the minimum criteria, the next layer in sequence is deposited. As before, the monitor mask pattern is included as part of the mask that is to be used at this point. However, the position of the mask relative to the main circuit is changed by shifting it by an amount no greater than its length—typically about half its length. This ensures that a step will be introduced between the layer about to be deposited and one that was just deposited. The shifting of the mask relative to its previous positions is repeated for each new layer that is deposited and etched up to a maximum of about 10 times. FIG. 4 shows how a series of such masks might appear. All mask images are located between the boundaries 42 of the kerf. Starting with mask image 41 the succession of mask images would be as shown (43 to 46 in this example).

Figure 1A:
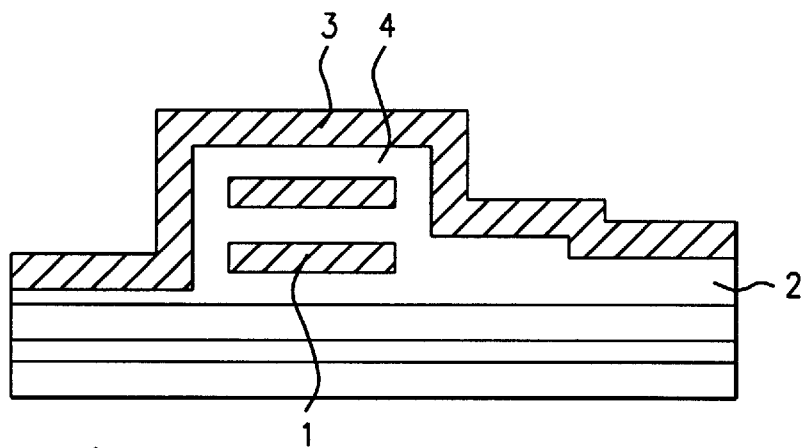
FIG. 1a is a schematic cross-section of part of integrated circuits showing a multi-layer structure that includes a number of steps.
Figure 1B:
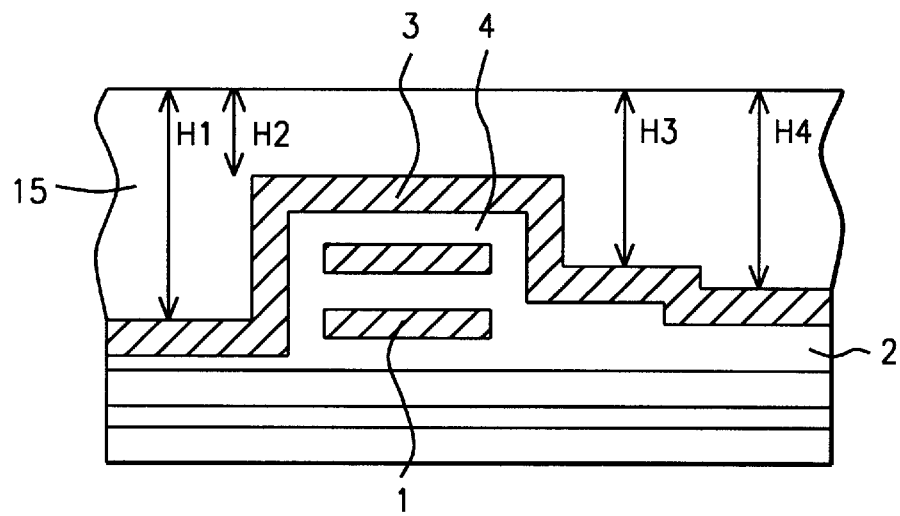
FIG. 1b shows a structure of FIG. 1a after it has been covered with layer of photo resist showing to the thickness of the photoresist can vary across the surface.
Figure 5:
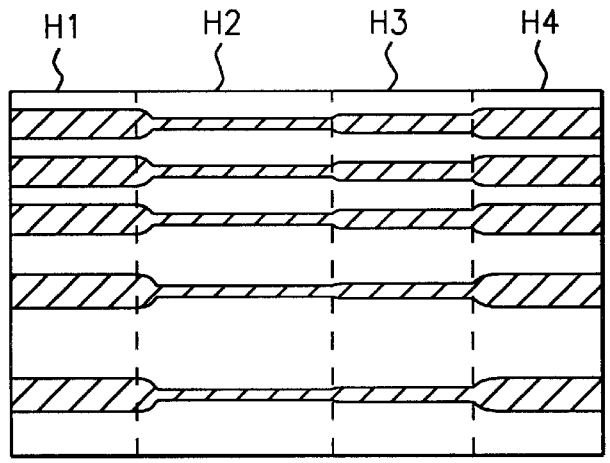
FIG. 5 shows an image of the monitor seen in FIG. 2 illustrating how the line with gets reduced in the problem areas.

FIG. 5 shows Howard image of the mask of FIG. 2 would appear for the structure shown in FIG. 1b if the problem was detected (i.e. if the layout photoresist was too thin in some spots). As can be seen in FIG. 1b, the layer are photoresist (layer 15 in that figure) is thinnest in the area of H2 and noticeably thicker at H1 and H4, with H3 being somewhere in between. The effects are these different thicknesses are reflected in the images shown in FIG. 5. In particular line widths in the areas corresponding to H2 are seen to be noticeably reduced.

Measuring the various line widths at successive stages, as discussed above is most easily accomplished by making a scanning electron microscope (SEM) image of known magnification of the lines and then measuring the widths directly on it.

The procedure of depositing, patterning, and etching successive layers is repeated as many times as needed (generally for between about 1 and 6 layers). If the surface of the integrated circuit is planarized at any point, a fresh monitor mask is introduced to begin a new series.

While the invention has been particularly shown and described with reference to the preferred embodiments thereof, it will be understood by those skilled in the art that various changes in form and details may be made without departing from the spirit and scope of the invention.

What is claimed is:

1. A procedure for in-situ process control monitoring, comprising:
   providing a monitor mask, having a length and including a plurality of parallel lines of varying first widths;
   providing a partially completed integrated circuit having chip images separated by a kerf;
   depositing a layer of a material over said integrated circuit and then performing the sequential steps of:
   (a) coating the layer with a photoresist pattern that includes an image of said monitor mask at a location within the kerf;
   (b) inspecting said photoresist monitor image, thereby determining second widths for said parallel lines;
   (c) terminating the procedure if said photoresist monitor image does not meet a first set of criteria;
   (d) etching the layer and stripping all photoresist, thereby forming an etch pattern image of said process control monitor;
   (e) inspecting the etch pattern image, thereby determining third widths for said parallel lines;
   (f) terminating the procedure if said etch pattern image does not meet a second set of criteria; and
   (g) until a preset number of layers has been deposited, shifting the mask by an amount that is less than said length, thereby forming a step between successively deposited layers, depositing another layer of a material and then returning to step (a).

2. The procedure of claim 1 wherein the layers of deposited material are selected from the group consisting of metals, polysilicon, silicon oxide, and silicon nitride.

3. The procedure of claim 1 wherein determining said second widths further comprises measuring these widths on an image generated by a scanning electron microscope.

4. The procedure of claim 1 wherein the first set of criteria are that said second widths should be less than said first widths by no more than about 30 percent.

5. The procedure of claim 1 wherein determining said third widths further comprises measuring these widths on an image generated by a scanning electron microscope.

6. The procedure of claim 1 wherein the second set of criteria are that said third widths should be less than said second widths by no more than about 30 percent.

7. The procedure of claim 1 wherein the amount that the mask is shifted is about ½ of its length.

8. The procedure of claim 1 wherein the number of times that the mask is shifted is between about 1 and 10.

9. The procedure of claim 1 wherein the preset number of layers is between about 1 and 10.

10. An in-situ process control monitor, comprising:

a first part that further comprises:
- an optical mask comprising:
  - a plurality of parallel lines having a first width, separated from one another by a first distance,
  - a first single line, parallel to said plurality, separated therefrom by a second distance, and having a second width, and
  - a second single line having a third width, parallel to and separated from the first single line by a third distance;

a second part comprising a photoresist image of the optical mask located in an area of an integrated circuit and overlying at least one layer of the integrated circuit; and a third part comprising a line pattern obtained by etching said layer of the integrated circuit.

11. The process monitor described in claim 10 wherein said first width is between about 0.3 and 0.6 microns.

12. The process monitor described in claim 10 wherein the first distance is between about 0.3 and 0.6 microns.

13. The process monitor described in claim 10 wherein said plurality contains between about 1 and 50 lines.

14. The process monitor described in claim 10 wherein said second width is between about 0.5 and 1 microns.

15. The process monitor described in claim 10 wherein the second distance is between about 0.5 and 1 microns.

16. The process monitor described in claim 10 wherein said third width is between about 0.8 and 1.5 microns.

17. The process monitor described in claim 10 wherein the third distance is between about 0.8 and 1.5 microns.

18. The process monitor described in claim 10 wherein the area in which the photoresist image is located is between adjacent chip images of the integrated circuit.

* * * * *